US012294334B2

(12) United States Patent
Park et al.

(10) Patent No.: US 12,294,334 B2
(45) Date of Patent: May 6, 2025

(54) IN-PHASE/QUADRATURE-PHASE GENERATING DEVICE AND PHASE SHIFT DEVICE USING THE SAME

(71) Applicant: ELECTRONICS AND TELECOMMUNICATIONS RESEARCH INSTITUTE, Daejeon (KR)

(72) Inventors: Jinseok Park, Daejeon (KR); Seong Mo Moon, Daejeon (KR); Byoung Sun Lee, Daejeon (KR); Jun Han Lim, Daejeon (KR); Dong Pil Chang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 194 days.

(21) Appl. No.: 18/156,894

(22) Filed: Jan. 19, 2023

(65) Prior Publication Data
US 2023/0353094 A1 Nov. 2, 2023

(30) Foreign Application Priority Data
Apr. 29, 2022 (KR) .................. 10-2022-0053411

(51) Int. Cl.
*H03D 7/16* (2006.01)
(52) U.S. Cl.
CPC ......... *H03D 7/166* (2013.01); *H03H 2218/04* (2013.01)
(58) Field of Classification Search
CPC .......... H03D 7/12; H03D 7/16; H03D 7/165; H03D 7/166; H03D 2200/0082; H03H 11/22; H03H 2218/04
See application file for complete search history.

(56) References Cited

U.S. PATENT DOCUMENTS

| | | | |
|---|---|---|---|
| 6,831,497 B2 | 12/2004 | Koh et al. | |
| 9,077,307 B2* | 7/2015 | Reynaert | .................. H03H 7/06 |
| 9,281,888 B1 | 3/2016 | Mu | |
| 11,233,495 B2* | 1/2022 | Yokomizo | ................ H03H 7/20 |
| 2011/0092169 A1 | 4/2011 | Savoj | |
| 2015/0280680 A1 | 10/2015 | Reynaert et al. | |
| 2020/0204160 A1 | 6/2020 | Lim et al. | |
| 2021/0159929 A1 | 5/2021 | Wu | |

FOREIGN PATENT DOCUMENTS

KR 20200076486 A 6/2020

OTHER PUBLICATIONS

Kaukovuori, J. et al., "Analysis and Design of Passive Polyphase Filters", IEEE Transactions on Circuits and Systems—I: Regular Papers, vol. 55, No. 10, pp. 3023-3037, Nov. 21, 2008.

* cited by examiner

*Primary Examiner* — Long Nguyen
(74) *Attorney, Agent, or Firm* — Rabin & Berdo, P.C.

(57) ABSTRACT

An I/Q signal generating apparatus and phase shift apparatus using the same are provided, the I/Q signal generating apparatus including: a first resonance circuit whose one end is connected to a first input terminal and whose other end is connected to a first output terminal; and a second resonance circuit whose one end is connected to the other end of the first resonance circuit or a second input terminal, and whose other end is connected to a second output terminal, wherein the first resonance circuit and the second resonance circuit each include a resistor, a capacitor connected in parallel with the resistor, and an inductor connected in a form of a cross between the resistor and the capacitor.

8 Claims, 11 Drawing Sheets

1-stage RCL PPF according to another embodiment 1-stage RCL PPF according to this embodiment Comparison of performance
(comparison of performance with conventional phase shift device)

| | MWCL '21 | TCAS2 '17 | TCAS2 '18 | TCAS2 '21 | ISSCC '19 | Embodiment of this disclosure |
|---|---|---|---|---|---|---|
| Gain (dB) | −3.5 | −5 | −5.2 | −2.8 | −3 | +0.8 |
| Power consumption (mw) | 6.6 | 27 | 6.6 | 18 | 14 | 9 |

*FIG. 11*

IN-PHASE/QUADRATURE-PHASE GENERATING DEVICE AND PHASE SHIFT DEVICE USING THE SAME

CROSS-REFERENCE TO RELATED APPLICATIONS

The present application is based on and claims the benefit of priority to Korean Patent Application Number 10-2022-0053411, filed on Apr. 29, 2022 in the Korean Intellectual Property Office, the entire disclosure of which is incorporated herein by reference.

TECHNICAL FIELD

The present disclosure relates to components of micro waves and millimeter waves, and more particularly, an I/Q signal generating device and a phase shift device using the same.

BACKGROUND

Many fields of application are emerging regarding frequency bands of micro waves and millimeter waves that enable the use of a wide range of frequencies from several GHz to several tens of GHz due to saturation of a low frequency band. Among transmission/reception components of this frequency band, I/Q (In-phase/Quadrature-phase) generators are used in many fields such as phase shifters, I/Q mixers, and vector modulators, and serve important roles. In particular, a 0-degree signal and a 90-degree signal outputted from an I/Q generator require high accuracy because they serve as a reference for a vector modulator that generates a modulation signal and for a phase shifter that controls the phase of each channel.

RC-polyphase filter (PPF) types are most frequently used as the I/Q generator. An RC-polyphase filter may have a 1-stage structure or a 2-stage structure. A problem with this is that the 1-stage structure has large phase or gain error whereas the 2-stage structure has large insertion loss.

SUMMARY

In view of the above, the present disclosure provides an I/Q signal generating device having a 1-stage RLC polyphase filter structure with small phase and gain errors and small insertion loss, and a phase shift device using the same.

According to an embodiment of the present disclosure, there is provided an I/Q signal generating device including: a first resonance circuit whose one end is connected to a first input terminal, and whose other end is connected to a first output terminal; and a second resonance circuit whose one end is connected to the other end of the first resonance circuit or a second input terminal, and whose other end is connected to a second output terminal, wherein the first resonance circuit and the second resonance circuit each include a resistor, a capacitor connected in parallel with the resistor, and an inductor connected in the form of a cross between the resistor and the capacitor.

In one implementation, the inductor may be disposed in a cross connected form between an output of the corresponding resonance circuit and an input of the another resonance circuit.

In one implementation, the ratio of a first output signal from the first output terminal and a second output signal from the second output terminal may be proportional to $$R\left(WC + \frac{1}{WL}\right),$$

wherein R represents the value of the resistor, C represents the value of the capacitor, L represents the value of the inductor, and W represents $2\pi*$frequency.

In one implementation, the value of the inductor and the value of the capacitor may be set to resonate with each other, and the value of the resistor may be set so that $$R\left(WC + \frac{1}{WL}\right) = 1,$$

wherein R represents the value of the resistor, C represents the value of the capacitor, L represents the value of the inductor, and W represents $2\pi*$frequency.

In one implementation, the I/Q signal generating device may further include: a third resonance circuit whose one end is connected to a third input terminal, and whose other end is connected to a third output terminal; and a fourth resonance circuit whose one end is connected to the other end of the third resonance circuit or a fourth input terminal, and whose other end is connected to a fourth output terminal, wherein the third resonance circuit and the fourth resonance circuit each include a resistor, a capacitor connected in parallel with the resistor, and an inductor connected in the form of a cross between the resistor and the capacitor.

In one implementation, the first resonance circuit may include: a first resistor whose one end is connected to the first input terminal, and whose other end is connected to the first output terminal; a first capacitor connected in parallel with the first resistor, whose one end is connected to one end of the first resistor, and whose other end is connected to an other end of the resistor of the second resonance circuit; and a first inductor whose one end is connected to the other end of the first resistor, and whose other end is connected to one end of the resistor of the second resonance circuit.

In one implementation, the second resonance circuit may include: a second resistor whose one end is connected to the second input terminal or the other end of the first inductor of the first resonance circuit, and whose other end is connected to the second output terminal; a second capacitor connected in parallel with the second resistor, whose one end is connected to one end of the second resistor, and whose other end is connected to an other end of the resistor of the third resonance circuit; and a second inductor whose one end is connected to the other end of the second resistor, and whose other end is connected to one end of the resistor of the third resonance circuit.

In one implementation, the third resonance circuit may include: a third resistor whose one end is connected to the third input terminal or the other end of the second inductor of the second resonance circuit, and whose other end is connected to the third output terminal; a third capacitor connected in parallel with the third resistor, whose one end is connected to one end of the third resistor, and whose other end is connected to an other end of the resistor of the fourth resonance circuit; and a third inductor whose one end is connected to the other end of the third resistor, and whose other end is connected to one end of the resistor of the fourth resonance circuit.

In one implementation, the fourth resonance circuit may include: a fourth resistor whose one end is connected to the fourth input terminal or the other end of the third inductor of the third resonance circuit, and whose other end is connected to the fourth output terminal; a fourth capacitor connected in parallel with the fourth resistor, whose one end is connected to one end of the fourth resistor, and whose other end is connected to an other end of the resistor of the first resonance circuit; and a fourth inductor whose one end is connected to the other end of the fourth resistor, and whose other end is connected to one end of the resistor of the first resonance circuit.

According to another embodiment of the present disclosure, there is provided a phase shift device including: an I/Q (In-phase/Quadrature-phase) signal generating device configured to generate a phase signal; a vector controller configured to generate a current control signal; and a vector generator configured to adjust amplitudes and directions of input phase vectors based on the phase signal and the current control signal and to generate a corresponding modulation signal, wherein the I/Q signal generating device includes: a first resonance circuit whose one end is connected to a first input terminal, and whose other end is connected to a first output terminal; and a second resonance circuit whose one end is connected to the other end of the first resonance circuit or a second input terminal, and whose other end is connected to a second output terminal, wherein the first resonance circuit and the second resonance circuit each include a resistor, a capacitor connected in parallel with the resistor, and an inductor connected in the form of a cross between the resistor and the capacitor.

In one implementation, the inductor may be disposed in a cross connected form between an output of the corresponding resonance circuit and an input of another resonance circuit.

In one implementation, the ratio of a first output signal from the first output terminal and a second output signal from the second output terminal may be proportional to $$R\left(WC + \frac{1}{WL}\right),$$

wherein R represents the value of the resistor, C represents the value of the capacitor, L represents the value of the inductor, and W represents 2π*frequency.

In one implementation, the value of the inductor and the value of the capacitor may be set to resonate with each other, and the value of the resistor may be set so that $$R\left(WC + \frac{1}{WL}\right) = 1,$$

wherein R represents the value of the resistor, C represents the value of the capacitor, L represents the value of the inductor, and W represents 2π*frequency.

In one implementation, the I/Q signal generating device may further include: a third resonance circuit whose one end is connected to a third input terminal, and whose other end is connected to a third output terminal; and a fourth resonance circuit whose one end is connected to the other end of the third resonance circuit or a fourth input terminal, and whose other end is connected to a fourth output terminal, wherein the third resonance circuit and the fourth resonance circuit each include a resistor, a capacitor connected in parallel with the resistor, and an inductor connected in the form of a cross between the resistor and the capacitor.

According to embodiments of the present disclosure, by having 1-stage structure of RLC polyphaser filter type and adding an inductor, I/Q accuracy as accurate as a 2-stage I/Q generator can be achieved and insertion loss can be improved. Furthermore, input/output matching can be done easily as the capacitance component is offset by the addition of the inductor.

Therefore, insertion loss can be reduced while minimizing phase and gain errors.

BRIEF DESCRIPTION OF THE DRAWINGS

FIG. 11 is a graph showing results of a comparison between the performance of a phase shift device including an I/Q signal generating device according to an embodiment of the present disclosure and the performance of a conventional phase shift device in the related art.

DETAILED DESCRIPTION

Figure 1:
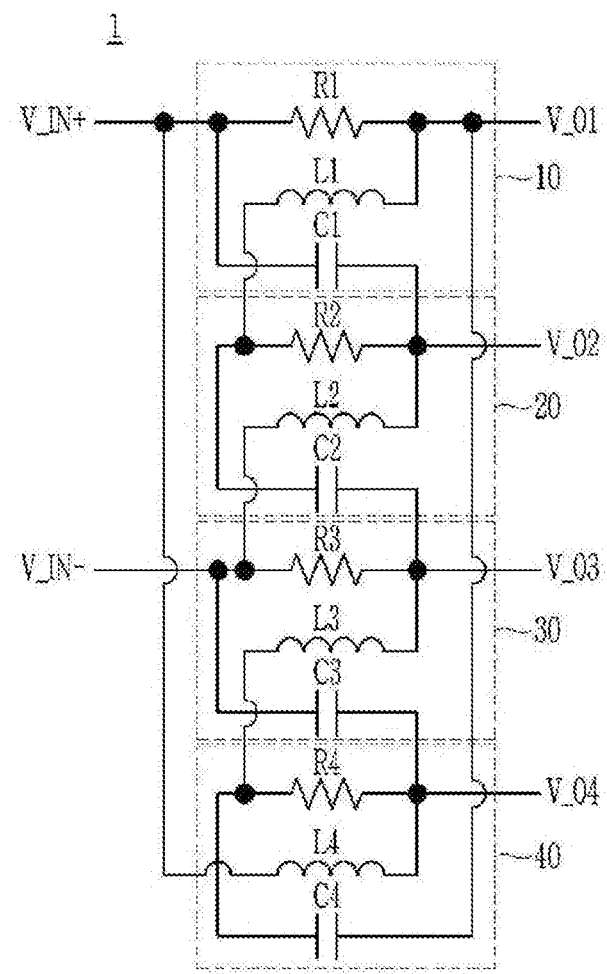
FIG. 1 is a view showing a structure of an I/Q signal generating device according to a first embodiment of the present disclosure.

In the following detailed description, only certain embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive. Like reference numerals designate like elements throughout the specification.

Throughout the specification, when a part is referred to "include" a certain element, it means that it may further include other elements rather than exclude other elements, unless specifically indicates otherwise.

Furthermore, when a part is referred to as being "connected to" or "coupled to" another part, it includes both a case in which a part is "directly connected or coupled to," another part and a case in which a part is "electrically connected or coupled to" another via another element. In addition, when a part is referred to "comprise" or "include" a certain element, it means that it may further include other elements rather than exclude other elements, unless specifically indicated otherwise.

In the description, expressions described in the singular in this specification may be interpreted as the singular or plural unless an explicit expression, such as "one" or "single" is used.

Terms, such as first, second, and the like may be used to describe various components and the components should not be limited by the terms. The terms are used only to discriminate one constituent element from another component. For example, a first component may be referred to as a second component, and similarly, the second component may be referred to as the first component without departing from the scope of the present disclosure.

Hereinafter, an I/Q signal generating device according to an embodiment of the present disclosure will be described with reference to the drawings.

A conventional I/Q signal generating device has a structure of RC-polyphase filter (PPF) type. Specifically, the conventional I/Q signal generating device may include a 1-stage RC-polyphase filter structure or a 2-stage RC-polyphase filter structure.

The 1-stage structure has very large phase or gain error although it has a simple structure and small insertion loss. Thus, an additional calibration circuit is necessary.

The 2-stage structure ensures high-performance accuracy because its phase and gain errors are greatly reduced, but it has very large insertion loss, which leads to a large reduction in system noise figure performance or error vector magnitude (EVM) performance. Thus, an I/Q generator with as small insertion loss as the 1-stage structure and as high accuracy as the 2-stage structure is necessary.

Moreover, input/output conjugate matching is quite important for an I/Q signal generating device that operates in a high frequency band. If poorly matched, large additional insertion loss may occur. An I/Q signal generating device with an RC PPF type structure has a large reactance component because it uses a capacitor.

Due to this, an additional matching circuit is required for 50 ohm matching, for example. To solve this, an I/Q signal generating device having an RC-RL PPF type structure may be used.

The I/Q signal generating device having an RC-RL PPF type structure eliminates capacitive performance by using an inductor instead of a capacitor at the second stage, thereby enabling input/output 50 ohm matching without an additional matching circuit. However, this structure also has large insertion loss because it is a 2-stage structure.

An embodiment of the present disclosure provides an I/Q signal generating device based on a polyphase filter using RLC, which has a 1-stage structure, has very small insertion loss as well as small phase and gain errors, and is operable in a wide frequency band.

FIG. 1 is a view showing a structure of an I/Q signal generating device according to a first embodiment of the present disclosure.

The I/Q signal generating device 1 may generate output signals having a plurality of phases by processing input signals. For example, the I/Q signal generating device 1 may generate at least two output signals V_O1, V_O2, V_O3, and V_O4 having a phase difference of 90 degrees from input signals V_IN+ and V_IN−. The I/Q signal generating device 1 may generate an I signal and a Q signal by using at least one resonance circuit. The I signal and the Q signal may mean signals with a relative phase difference of 90 degrees.

As shown in FIG. 1, the I/Q signal generating device 1 according to the first embodiment of the present disclosure may have a polyphase filter structure using RLC.

Specifically, the I/Q signal generating device 1 may include first to fourth resonance circuits 10 to 40 and may have a structure in which one end of each resonance circuit is connected to the other end of another resonance circuit.

The I/Q signal generating device 1 may generate four signals having an orthogonal phase by using the first to fourth resonance circuits 10 to 40. Each resonance circuit 10 to 40 includes a resistor, a capacitor connected in parallel with the resistor, and an inductor connected in the form of a cross between the resistor and the capacitor. Here, one end of the resistor is connected to an input terminal or the other end of another resonance circuit, and the other end of the resistor is connected to an output terminal. One end of the capacitor is connected to one end of the resistor, and the other end of the capacitor is connected to one end of another resonance circuit. One end of the inductor is connected to the other end of the resistor, i.e., an output terminal, and the other end of the inductor is connected to the other end of another resonance circuit. In this way, in each resonance circuit 10 to 40, the inductor is disposed in a cross connected form between an output of the corresponding resonance circuit and an input of the another resonance circuit.

In a first exemplary embodiment of the present disclosure, two input signals V_IN+ and V_IN− are inputted into the first resonance circuit 10 and the third resonance circuit 30 through two input terminals, which then generate four output signals V_O1 to V_O4.

To this end, specifically, the first resonance circuit 10 includes a first resistor R1, a first capacitor C1, and a first inductor L1. One end of the first resistor R1 is connected to an input terminal V_IN+, the other end of the first resistor R1 is connected to an output terminal V_O1, one end of the first capacitor C1 is connected to one end of the first resistor R1, the other end of the first capacitor C1 is connected to an output terminal V_O2 of the second resonance circuit 20, one end of the first inductor L1 is connected to the output terminal V_O1, and the other end of the first inductor L1 is connected to an input portion of the second resonance circuit 20.

The second resonance circuit 20 includes a second resistor R2, a second capacitor C2, and a second inductor L2. One end of the second resistor R2 is connected to the other end of the inductor L1 of the first resonance circuit 10, the other end of the second resistor R2 is connected to the output terminal V_O2, one end of the second capacitor C2 is connected to one end of the second resistor R2, the other end of the second capacitor C2 is connected to an output terminal V_O3 of the third resonance circuit 30, one end of the second inductor L2 is connected to the output terminal V_O2, and the other end of the second inductor L2 is connected to an input portion of the third resonance circuit 30.

The third resonance circuit 30 includes a third resistor R3, a third capacitor C3, and a third inductor L3. One end of the third resistor R3 is connected to an input terminal V_IN− and also connected to the other end of the inductor L2 of the second resonance circuit 20, the other end of the third resistor R3 is connected to the output terminal V_03, one end of the third capacitor C3 is connected to one end of the third resistor R3, the other end of the third capacitor C3 is connected to an output terminal V_04 of the fourth resonance circuit 40, one end of the third inductor L3 is connected to the output terminal V_03, and the other end of the third inductor L3 is connected to an input portion of the fourth resonance circuit 40.

The fourth resonance circuit 40 includes a fourth resistor R4, a fourth capacitor C4, and a fourth inductor L4. One end of the fourth resistor R4 is connected to the other end of the inductor L3 of the third resonance circuit 30, the other end of the fourth resistor R4 is connected to an output terminal V_04, one end of the fourth capacitor C4 is connected to one end of the fourth resistor R4, the other end of the fourth capacitor C4 is connected to an output terminal V_01 of the first resonance circuit 10, one end of the fourth inductor L4 is connected to the output terminal V_04, and the other end of the fourth inductor L4 is connected to an input portion of the first resonance circuit 10.

The I/Q signal generating device 1 having such a structure operates as follows.

Differential signals V_in+ and V_in− are fed as input into the IQ signal generating device 1. Once this input has passed through the I/Q signal generating device 1 of 1-stage RLC polyphase filter type, four output signals V_01, V_02, V_03, V_04 are produced. In this case, a transfer function of V_01 and V_02 is obtained by using an equivalent circuit, and then the ratio $$\left(\frac{V_{02}}{V_{01}}\frac{V_{02}}{V_{01}}\right)$$

of the two output signals is calculated as follows.

$$\frac{V_{02}}{V_{01}} = R\left(SC - \frac{1}{SL}\right) = jR\left(WC + \frac{1}{WL}\right) \quad \text{Equation 1}$$

Here, R, C, and L represent the value of the resistor used, the value of the capacitor, and the value of the inductor, and W represents 2π*frequency.

In Equation 1, the value of $$\frac{V_{02}}{V_{01}}\frac{V_{02}}{V_{01}}$$

which is the ratio of output signals has an imaginary component only. Thus, it can be seen that V_02 and V_01 always maintain a difference of 90 degrees regardless of frequency. Likewise, by calculating the ratio of V_04 and V_03, it can easily be seen that V_04 and V_03 always maintain a difference of 90 degrees regardless of frequency.

In this case, since V_01 and V_03 always maintain a difference of 180 degrees due to the symmetrical structure, V_01, V_02, V_03, and V_04 always maintain a difference of 0 degrees, 90 degrees, 180 degrees, and 270 degrees, respectively, regardless of frequency. Accordingly, the I/Q signal generating device 1 may be used as a wide band I/Q generator.

In order to be used as an I/Q generator with higher accuracy, the amplitude of four output signals each with a difference of 90 degrees between them needs to be kept constant. In the case of the conventional 1-stage I/Q generator, the ratio of V_1 and V_2 is proportional to R*W*C. Accordingly, the amplitude of two signals are constant at a center frequency W=1/RC, but the value of R*W*C changes greatly with frequency, thereby leading to a significant difference between the amplitudes of the two signals. However, in the case of the I/Q signal generating device 1 according to the embodiment of the present disclosure, it can be seen from Equation 1 that the ratio of the amplitude of V_01 and V_02 is proportional to $$R\left(WC + \frac{1}{WL}\right).$$

In this case, WC increases with increasing frequency, but 1/WL decreases with increasing frequency, which allows the two signals to maintain a small amplitude difference in a relatively wide frequency band.

To this end, it is important to select appropriate values of R, L, and C. The value of L and the value of C are selected so that L and C may resonate. Accordingly, the imaginary component of (W2=(1/LC)) input/output impedance is offset, thus making it easy to achieve 50 ohm matching without an additional matching circuit.

Thus, the value of L and the value of C are set so that L and C resonate, and the value of R is selected such that $$R\left(WC + \frac{1}{WL}\right) = 1,$$

so that the two output signals (e.g., V_01 and V_02) have equal amplitude.

According to this embodiment, phase and gain errors can be greatly improved compared to the conventional 1-stage I/Q generator, and input/output matching can be easily be implemented. Moreover, the use of only one stage brings a large improvement in insertion loss and complexity as compared to the conventional 2-stage structure.

Moreover, by adding an inductor which has 1-stage and is of RLC polyphase filter type, the added inductor offsets the imaginary component increasing with increasing frequency. Accordingly, the I/Q signal generating device 1 may operate over a wide frequency band, and, in particular, the gain error in a 10 GHz band may be greatly reduced from the existing 4 dB to 0.3 dB.

Figure 2:
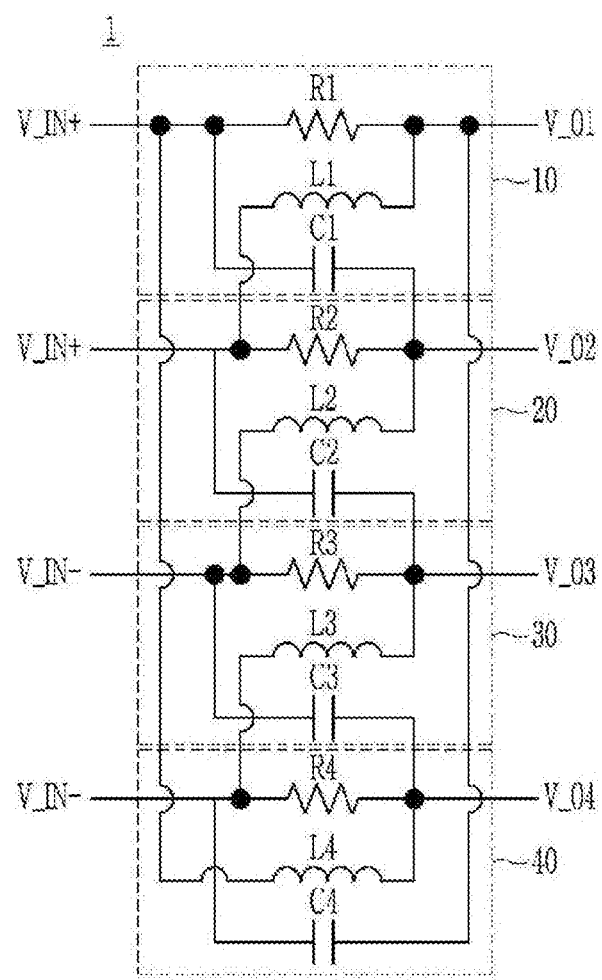
FIG. 2 is a view showing a structure of an I/Q signal generating device according to a second embodiment of the present disclosure.

FIG. 2 is a view showing a structure of an I/Q signal generating device according to a second embodiment of the present disclosure.

The I/Q signal generating device according to the second embodiment of the present disclosure has the same structure as the foregoing first embodiment, except that an input signal is put into four parts. That is, the I/Q signal generating device 1 according to the second embodiment of the present disclosure includes first to fourth resonance circuits 10 to 40 as shown in FIG. 2, and two input signals V_IN+ and V_IN− are fed into the first resonance circuit 10, the second resonance circuit 20, the third resonance circuit 30, and the fourth resonance circuit 40 through four input terminals, and four output signals V_02 to V_04 are produced.

As in the foregoing first embodiment, the first to fourth resonance circuits 10 to 40 include first to fourth resonance circuits 10 to 40, and each of the resonance circuits 10 to 40 includes a resistor, a capacitor connected in parallel with the resistor, and an inductor connected in the form of a cross between the resistor and the capacitor. Here, one end of the resistor is connected to an input terminal or the other end of another resonance circuit, and the other end of the resistor is connected to an output terminal. One end of the capacitor is connected to one end of the resistor, and the other end of the capacitor is connected to one end of another resonance circuit. One end of the inductor is connected to the other end of the resistor, i.e., an output terminal, and the other end of the inductor is connected to the other end of another resonance circuit. V_IN+, V_IN+, V_IN−, and V_IN− are inputted into input portions of the resonance circuits 10 to 40, respectively. Accordingly, one end of a resistor R1 of the first resonance circuit 10 is connected to an input terminal V_IN+, one end of a resistor R2 of the second resonance circuit 20 is connected to an input terminal V_IN+, one end of a resistor R3 of the third resonance circuit 30 is connected to an input terminal V_IN−, and one end of a resistor R4 of the fourth resonance circuit 40 is connected to an input terminal V_IN−. The connection relationship between the other components is identical to that of the foregoing first embodiment, so a detailed description thereof will be omitted.

With this structure, the I/Q signal generating device according to the second embodiment of the present disclosure operates in the same manner as the foregoing first embodiment. According to the first embodiment, no phase error occurs at all and only a small gain error occurs. According to the second embodiment, no gain error occurs at all and a very small phase error occurs. An I/Q signal generating device based on a polyphase filter using such an RLC can be used in a variety of systems.

With this structure, the I/Q signal generating device according to the embodiment of the present disclosure has the following performance characteristics.

Figure 3:
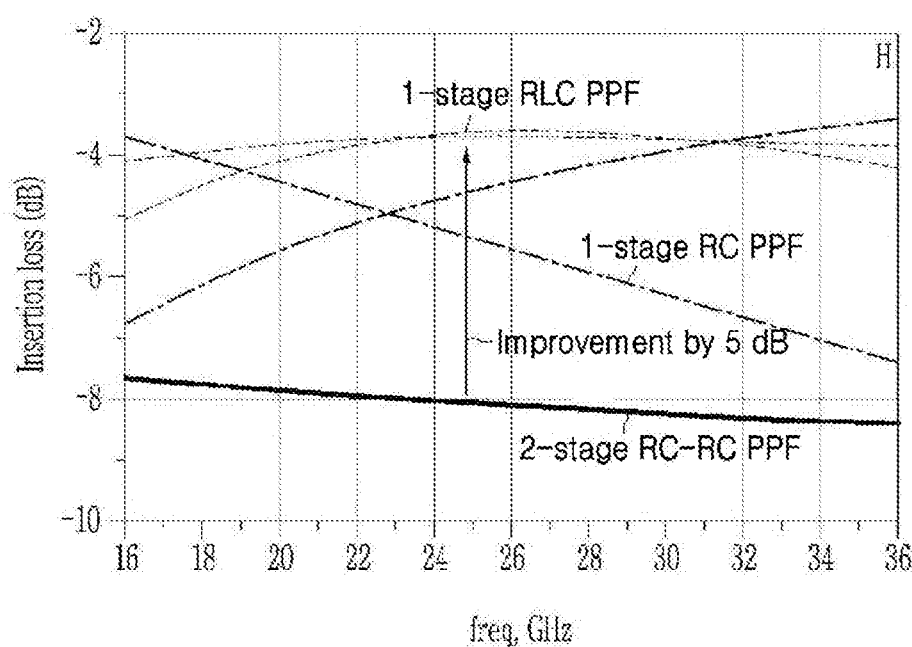
FIG. 3 is a graph showing insertion loss characteristics of a conventional I/Q signal generating device and of an I/Q signal generating device according to an embodiment of the present disclosure.

FIG. 3 is a graph showing insertion loss characteristics of a conventional I/Q signal generating device and of an I/Q signal generating device according to an embodiment of the present disclosure.

As shown in the accompanying FIG. 3, a conventional RC-RC PPF-based I/Q signal generating device has considerably large insertion loss due to a 2-stage configuration connected in a cascade. On the other hand, it can be seen that in an RLC PPF-based I/Q signal generating device according to an embodiment of the present disclosure, insertion loss is improved by about 5 dB because of its simple structure, as compared to the conventional I/Q signal generating device. In particular, it can be seen that the insertion loss of the I/Q signal generating device according to the embodiment of the present disclosure is less than the insertion loss of the conventional 1-stage, RC PPF-based I/Q signal generating device. This is because the capacitance component is resonated out due to the added inductor, thereby enabling input matching without an additional circuit.

Figure 4:
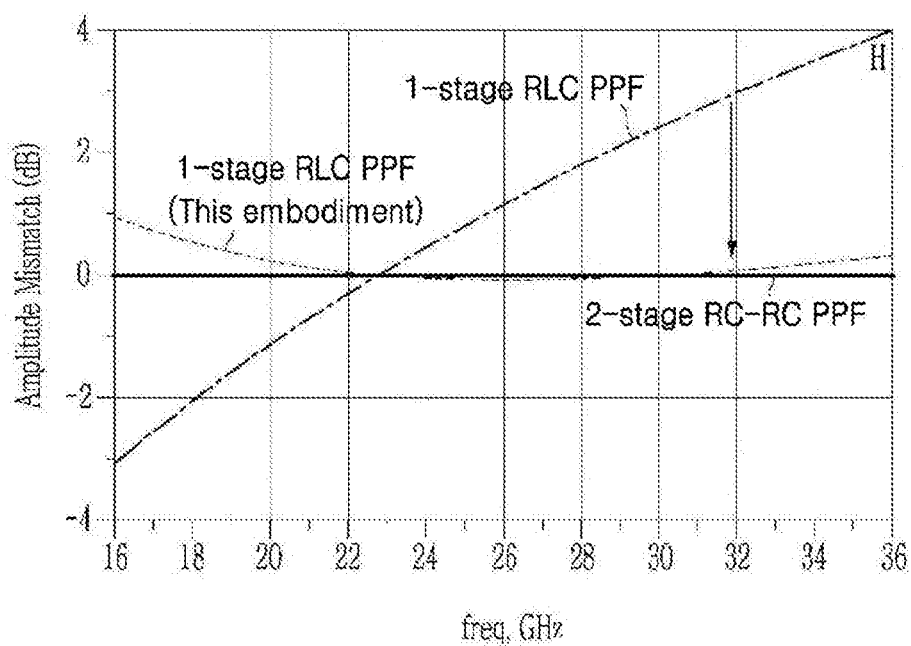
FIG. 4 is a graph of output gain error versus frequency for a conventional I/Q signal generating device and for an I/Q signal generating device according to an embodiment of the present disclosure.

FIG. 4 is a graph of output gain error versus frequency for a conventional I/Q signal generating device and for an I/Q signal generating device according to an embodiment of the present disclosure.

As explained above, the conventional 1-stage RC PPF type I/Q generating device has no error at the center frequency, but has considerably large gain error as the frequency changes in proportion to R*W*C. In contrast, the proposed structure shows considerably small maximum gain error of 0.25 dB in a band of 20 to 30 GHz.

Figure 5:
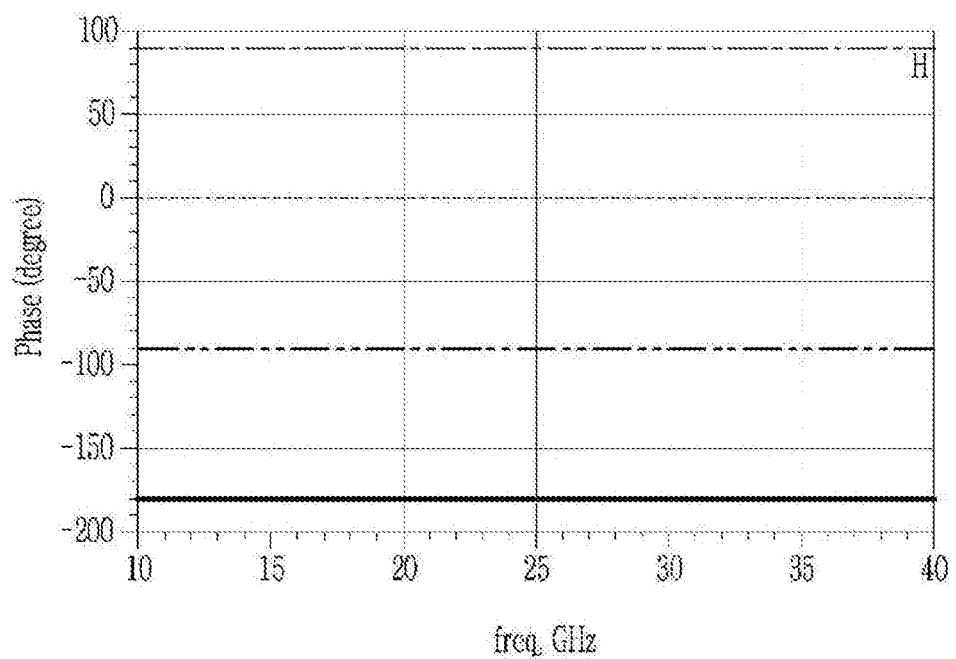
FIG. 5 is a graph of phase differences between four outputs versus frequency for an I/Q signal generating device according to an embodiment of the present disclosure.

FIG. 5 is a graph of phase differences between four outputs versus frequency for an I/Q signal generating device according to an embodiment of the present disclosure. From the above calculation, it can be observed that the four outputs always maintain a difference of 90 degrees regardless of frequency.

Figure 6:
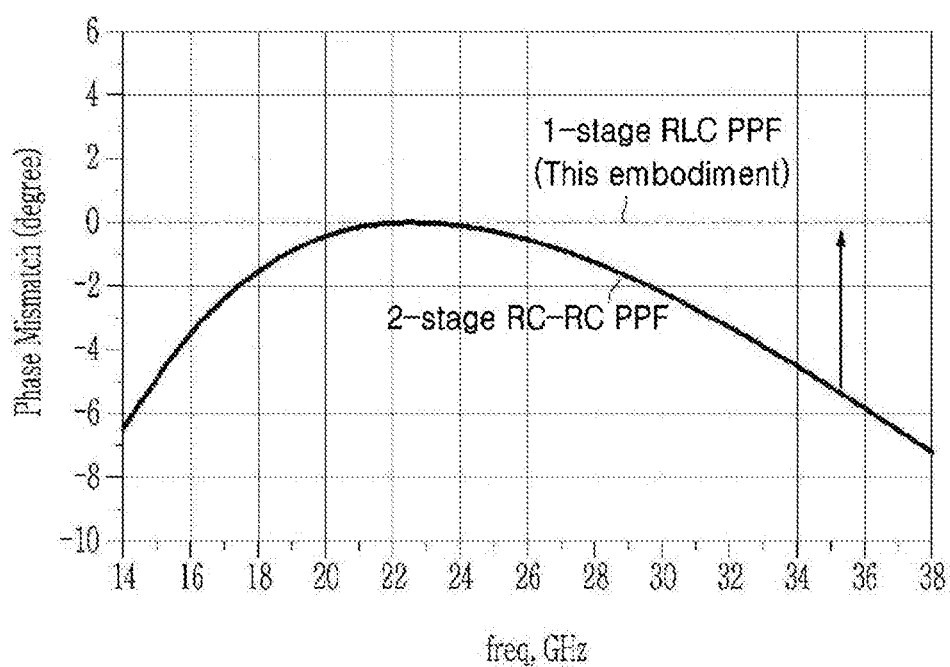
FIG. 6 is a graph showing phase error values of a conventional I/Q signal generating device and of an I/Q signal generating device according to an embodiment of the present disclosure.

FIG. 6 is a graph showing phase error values of a conventional I/Q signal generating device and of an I/Q signal generating device according to an embodiment of the present disclosure.

As shown in FIG. 6, it can be seen that the phase error of the conventional I/Q signal generating device changes with frequency, whereas the I/Q signal generating device according to the embodiment of the present disclosure has no phase error despite changes in frequency. As compared to the conventional 2-stage RC-RC PPF type I/Q signal generating device, the I/Q signal generating device according to the embodiment of the present disclosure is improved by 3 degrees or more.

Meanwhile, the I/Q signal generating device according to the embodiment of the present disclosure is applicable to a phase shifter.

Figure 7:
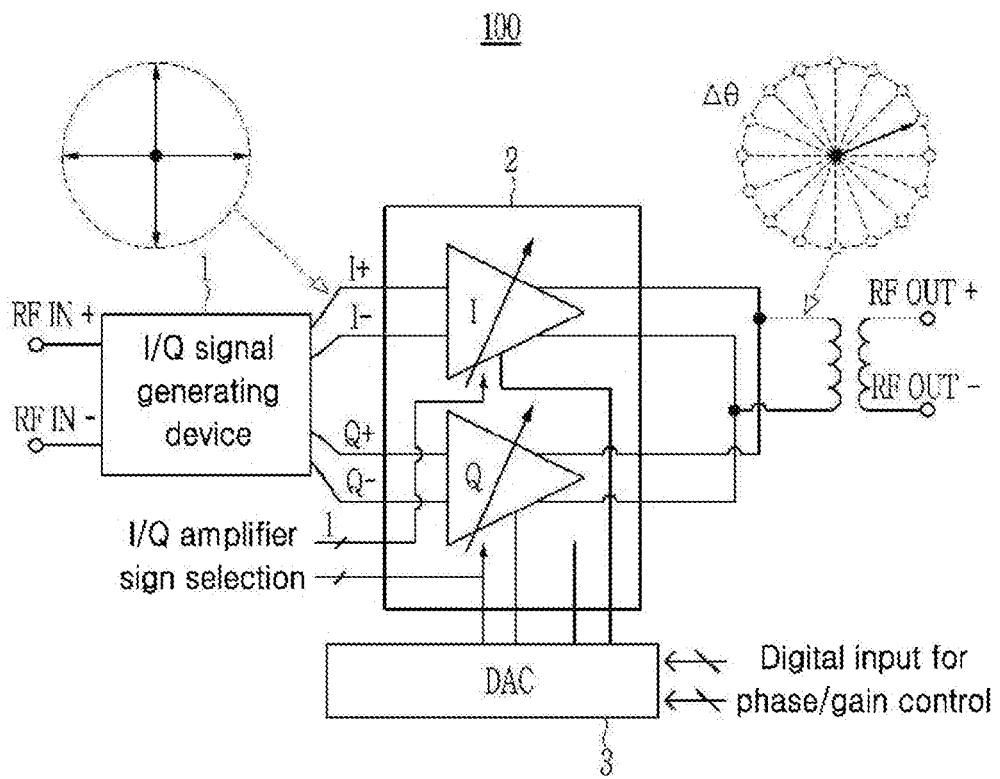
FIG. 7 is a view showing a structure of a phase shift device including an I/Q signal generating device according to an embodiment of the present disclosure.

FIG. 7 is a view showing a structure of a phase shift device including an I/Q signal generating device according to an embodiment of the present disclosure.

As shown in FIG. 7, the phase shift device 100 includes an I/Q signal generating device 1, a vector generator 2, and a digital-to-analog converter (DAC) 3.

The I/Q signal generating device 1 generates phase signals, for example, a 0-degree signal, a 90-degree signal, 180-degree signal, and a 270-degree signal, and is formed of a structure according to the foregoing first embodiment or a structure according to the foregoing second embodiment.

The DAC 3 generates a current control signal and provides it to a vector generator 2. It is also referred to as a dual vector control DAC or a vector controller. The vector generator 2 adjusts the magnitude and direction of phase vectors based on a phase signal (I, Q) generated from the I/Q signal generating device 1, an I/Q amplifier sign selection signal, and a current control signal, and generates a corresponding modulation signal.

The I/Q signal generating device is also used on an I/Q mixer, as well as on such a phase shift device.

Figure 8:
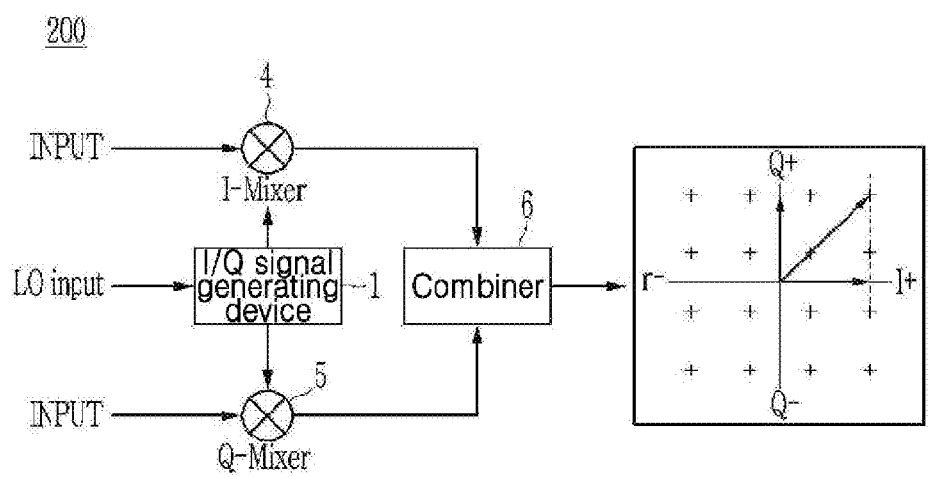
FIG. 8 is a view showing a structure of an I/Q mixer including an I/Q signal generating device according to an embodiment of the present disclosure.

FIG. 8 is a view showing a structure of an I/Q mixer including an I/Q signal generating device according to an embodiment of the present disclosure.

As shown in FIG. 8, the I/Q mixer 200 includes an I/Q signal generating device 1, an I mixer 4, a Q mixer 5, and a combiner 6.

The I/Q signal generating device 1 generates phase signals, for example, a 0-degree signal, a 90-degree signal, a 180-degree signal, and a 270-degree signal, in accordance with an input (L0 input), and is formed of a structure according to the foregoing first embodiment or a structure according to the foregoing second embodiment.

The I mixer 4 outputs a phase signal from the I/Q signal generating device 1 and an input signal (INPUT) by mixing them, the Q mixer 5 outputs a phase signal from the I/Q signal generating device 1 and an input signal (INPUT) by mixing them, and the combiner 6 outputs a signal from the I mixer 4 and a signal from the Q mixer 5 by combining them.

Figure 9:
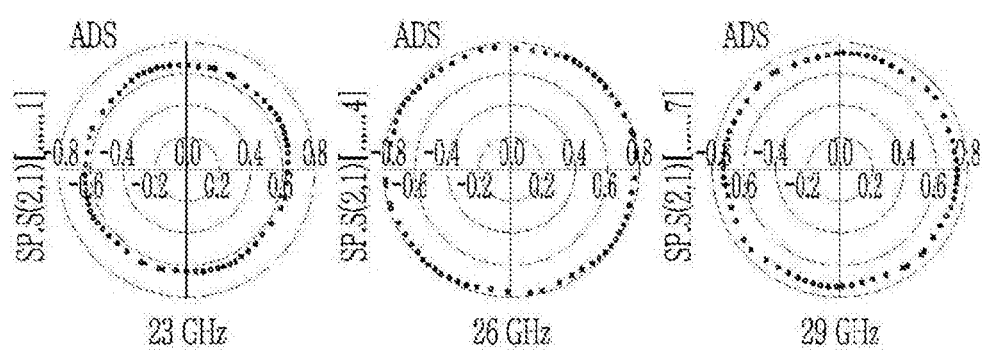
FIG. 9 is a graph showing simulation results of a phase shift device including an I/Q signal generating device according to an embodiment of the present disclosure.

FIG. 9 is a graph showing simulation results of a phase shift device including an I/Q signal generating device according to an embodiment of the present disclosure.

As a result of implementing the phase shift device as in the structure of FIG. 7 and performing Full-EM simulation, a vector diagram as shown in FIG. 9 may be obtained. From the vector diagram of FIG. 9, it can be seen that phase control is working well because the I/Q signal generating device is making references of 0 degrees, 90 degrees, 180 degrees, and 270 degrees. In particular, it can be seen that there is no error in operation over a wide bandwidth up to 23 to 30 GHz which is a main frequency band of 5G mobile communication.

Figure 10A:
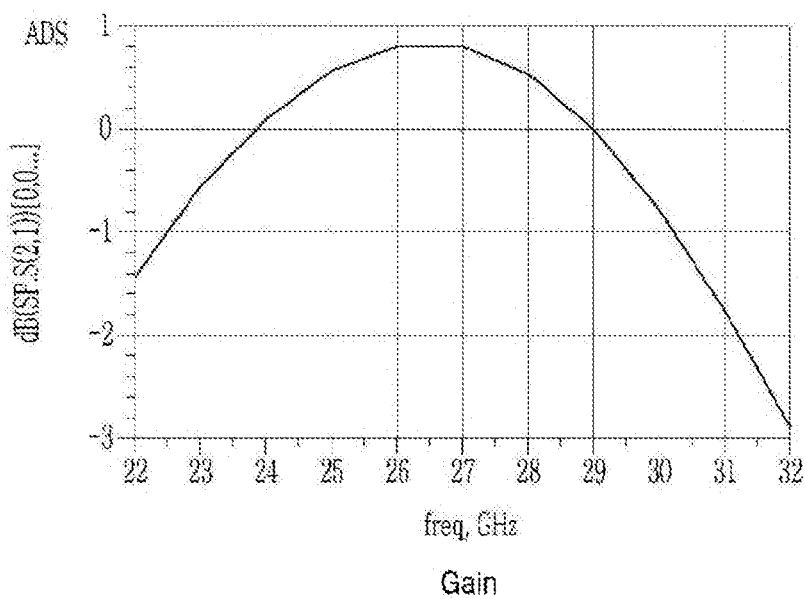
FIGS. 10A and 10B are graphs showing gain and input return loss of a phase shift device including an I/Q signal generating device according to an embodiment of the present disclosure.
Figure 10B:
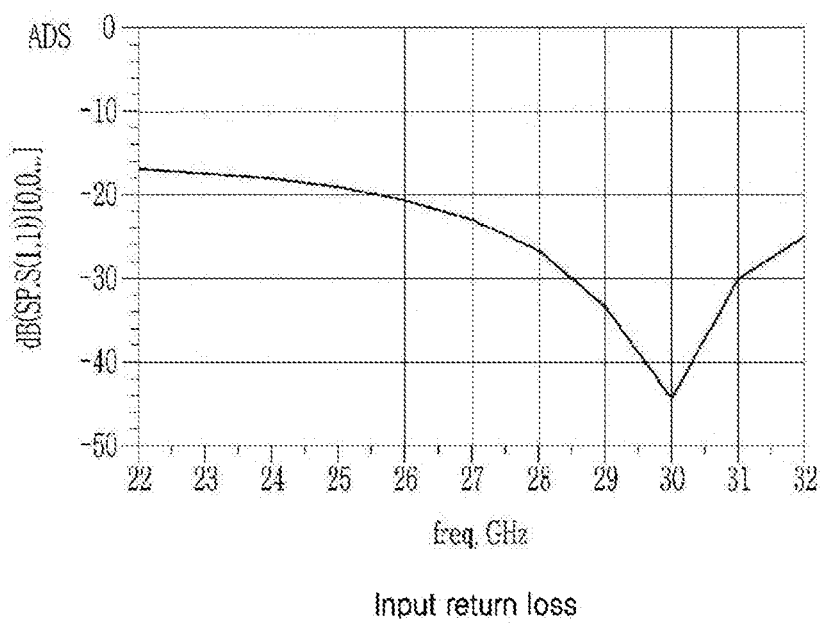

FIGS. 10A and 10B are graphs showing gain and input return loss of a phase shift device including an I/Q signal generating device according to an embodiment of the present disclosure.

FIG. 10A depicts gain of a phase shift device including Full-EM. As illustrated herein, it can be seen that there is a peak gain of 0.8 dB. While conventional phase shifters with a similar frequency band and similar power consumption have an insertion loss of −3 to −6 dB, the insertion loss of the phase shift device including the I/Q signal generating device according to the embodiment of the present disclosure is reduced by about 4 to 7 dB. This is because the insertion loss of the I/Q signal generating device according to the embodiment of the present disclosure is reduced by as much.

FIG. 10B depicts input return loss of a phase shift device including Full-EM. Input return loss is a numeral value showing how well the input of the I/Q signal generating device is matched to 50 ohm. As described above, the value of L and the value of C are selected adequately so that L and C resonate, removing the reactance component, and the value of R may be selected adequately and matched to 50 ohm, thereby improving chip size and insertion loss. Also, it can be seen that input return loss (S11)<−10 dB in a wide frequency band of 15 to 35 GHz without an additional matching network.

FIG. 11 shows results of a comparison between the performance of a phase shift device including an I/Q signal generating device according to an embodiment of the present disclosure and the performance of a conventional phase shift device in the related art.

According to the table shown in FIG. 11, unlike the conventional phase shift devices, only the phase shift device including the I/Q signal generating device according to an embodiment of the present disclosure produced gain, whereas the conventional phase shift devices had loss of 3 to 5.2 dB.

According to these embodiments, there is provided an I/Q signal generating device that has small phase and gain errors, small insertion loss, and easy input/output matching, and the I/Q signal generating device is applicable to various systems such as a wireless power transmission and radar system using a phase shifter, a vector modulator, an I/Q mixer, and a phase array antenna.

While the invention has been described with reference to exemplary embodiments thereof, one of ordinary skill in the art would understand that various changes in form and details may be made therein without departing from the idea and scope of the invention as defined by the claims and equivalents thereof.

What is claimed is:

1. An I/Q signal generating apparatus comprising:
   a first resonance circuit including a first resistor, a first capacitor and a first inductor; and
   a second resonance circuit including a second resistor, a second capacitor and a second inductor;
   wherein
   the first resistor is connected at one end to a first input terminal, and connected at another end to a first output terminal;
   the second resistor is connected at one end to a second input terminal, and connected at another end to a second output terminal;
   the first capacitor is connected to the one end of the first resistor and to the other end of the second resistor; and
   the first inductor is connected to the other end of the first resistor and to the one end of the second resistor, crossing between the first resistor and the first capacitor.

2. The I/Q signal generating apparatus of claim 1, wherein a ratio of a first output signal from the first output terminal and a second output signal from the second output terminal is proportional to $$R\left(WC + \frac{1}{WL}\right),$$

and
wherein R represents a value of the first resistor and the second resistor, C represents a value of the first capacitor and the second capacitor, L represents a value of the first inductor and the second inductor, and W represents 2π*frequency.

3. The I/Q signal generating apparatus of claim 1, wherein a value of the first inductor and a value of the first capacitor are set to resonate with each other, a value of the second inductor and a value of the second capacitor are set to resonate with each other, and a value of the first resistor and the second resistor is set so that $$R\left(WC + \frac{1}{WL}\right) = 1,$$

and
wherein R represents the value of the first resistor and the second resistor, C represents the value of the first capacitor and the second capacitor, L represents the value of the first inductor and the second inductor, and W represents 2π*frequency.

4. The I/Q signal generating apparatus of claim 1, further comprising:
   a third resonance circuit including a third resistor, a third capacitor and a third inductor; and
   a fourth resonance circuit including a fourth resistor, a fourth capacitor and a fourth inductor;
   wherein
   the third resistor is connected at one end to a third input terminal, and connected at another end to a third output terminal;
   the fourth resistor is connected at one end to a fourth input terminal, and connected at another end to a fourth output terminal;
   the third capacitor is connected to the one end of the third resistor and to the other end of the fourth resistor; and
   the third inductor is connected to the other end of the third resistor and to the one end of the fourth resistor, crossing between the third resistor and the third capacitor.

5. A phase shift apparatus comprising:
an In-phase/Quadrature-phase (I/Q) signal generating apparatus configured to generate a phase signal;
a vector controller configured to generate a current control signal; and
a vector generator configured to adjust amplitudes and directions of input phase vectors based on the phase signal and the current control signal and to generate a corresponding modulation signal,
wherein the I/Q signal generating apparatus comprises:
a first resonance circuit including a first resistor, a first capacitor and a first inductor; and
a second resonance circuit including a second resistor, a second capacitor and a second inductor;
wherein
the first resistor is connected at one end to a first input terminal, and connected at another end to a first output terminal;
the second resistor is connected at one end to a second input terminal, and connected at another end to a second output terminal;
the first capacitor is connected to the one end of the first resistor and to the other end of the second resistor; and
the first inductor is connected to the other end of the first resistor and to the one end of the second resistor, crossing between the first resistor and the first capacitor.

6. The phase shift apparatus of claim 5, wherein a ratio of a first output signal from the first output terminal and a second output signal from the second output terminal is proportional to $$R\left(WC + \frac{1}{WL}\right),$$

and
wherein R represents a value of the first resistor and the second resistor, C represents a value of the first capacitor and the second capacitor, L represents a value of the first inductor and the second inductor, and W represents 2π*frequency.

7. The phase shift apparatus of claim 5, wherein a value of the first inductor and a value of the first capacitor are set to resonate with each other, a value of the second inductor and a value of the second capacitor are set to resonate with each other, and a value of the first resistor and the second resistor is set so that $$R\left(WC + \frac{1}{WL}\right) = 1,$$

and
wherein R represents the value of the first resistor and the second resistor, C represents the value of the first capacitor and the second capacitor, L represents the value of the first inductor and the second inductor, and W represents 2π*frequency.

8. The phase shift apparatus of claim 5, wherein the I/Q signal generating apparatus further comprises:
a third resonance circuit including a third resistor, a third capacitor and a third inductor; and
a fourth resonance circuit including a fourth resistor, a fourth capacitor and a fourth inductor;
wherein
the third resistor is connected at one end to a third input terminal, and connected at another end to a third output terminal;
the fourth resistor is connected at one end to a fourth input terminal, and connected at another end to a fourth output terminal;
the third capacitor is connected to the one end of the third resistor and to the other end of the fourth resistor; and
the third inductor is connected to the other end of the third resistor and to the one end of the fourth resistor, crossing between the third resistor and the third capacitor.

* * * * *